United States Patent [19]

Megens et al.

[11] Patent Number: 5,144,535

[45] Date of Patent: Sep. 1, 1992

[54] METHOD OF MOUNTING ELECTRICAL AND/OR ELECTRONIC COMPONENTS OF A PRINTED CIRCUIT BOARD

[75] Inventors: Ludovicus Megens; Petrus H. A. A. Vriens; George A. A. Asselman; Gerardus Notenboom, all of Eindhoven, Netherlands

[73] Assignee: U.S. Philips Corporation, New York, N.Y.

[21] Appl. No.: 508,040

[22] Filed: Apr. 10, 1990

[30] Foreign Application Priority Data

Apr. 20, 1989 [NL] Netherlands ............... 8900987

[51] Int. Cl.⁵ .................... H05K 3/30; H05K 3/34
[52] U.S. Cl. ................... 361/400; 361/417;
 361/419; 174/260; 439/83; 439/84
[58] Field of Search .............. 361/400, 404, 410, 417,
 361/419; 174/260, 267; 439/83, 84

[56] References Cited

U.S. PATENT DOCUMENTS

| | | |
|---|---|---|
| 3,213,325 | 10/1962 | Lindstrand ............... 361/417 |
| 3,485,996 | 12/1969 | Chiou et al. . | 
| 3,586,816 | 6/1971 | Hagen . |
| 4,139,881 | 2/1979 | Shimizu et al. ............... 361/400 |
| 4,242,719 | 12/1980 | Conley ............... 361/400 |
| 4,515,304 | 5/1985 | Berger . |
| 4,631,639 | 12/1986 | Biraud ............... 361/417 |
| 4,761,881 | 8/1988 | Bora et al. ............... 361/400 X |

FOREIGN PATENT DOCUMENTS 0058766 8/1985 European Pat. Off. .

*Primary Examiner*—Leo P. Picard
*Assistant Examiner*—Paramita Ghosh
*Attorney, Agent, or Firm*—William Squire

[57] ABSTRACT

A method of mounting SMD components (6, 7, 8) and wire components (21, 22) on a printed circuit board (2), in which the wire components (21, 22) ae secured on the printed circuit board (2) by means of connection elements (13, 14). The SMD components (6, 7, 8) and the connection elements (13, 14) are secured by reflow soldering on the printed circuit board (2), while the wire components (21, 22) are connected by their connection wires (19, 20) to the connection elements (13, 14) by welding.

4 Claims, 2 Drawing Sheets

METHOD OF MOUNTING ELECTRICAL AND/OR ELECTRONIC COMPONENTS OF A PRINTED CIRCUIT BOARD

The invention relates to a method of mounting electrical and electronic components on a printed circuit board, in which SMD components with contact surface are connected directly and wire components with connection wires are connected via mounting holes in the printed circuit board by means of a soldering connection to the printed circuit board.

Of interest is copending application entitled "Method of mounting electrical and/or electronic components on a single-sided printed circuit board" filed concurrently herewith by Megens et al. and assigned to the assignee as the present invention.

In such a method known from U.S. Pat. No. 4,139,881, the connection wires of the wire components are passed from the non-printed side of the printed circuit board through the mounting holes and clinched; the SMD components are fixed by means of a dot of glue on the printed conductor side of the printed circuit board, after which the printed circuit board is passed with the printed conductor side along a soldering wave and the wire components and the SMD components are soldered on the printed circuit board simultaneously. The term SMD (Surface-Mounted Devices) components is to be understood to mean components which are intended and/or suitable for surface mounting.

It has been found in practice that the wave soldering process is particularly suitable for soldering wire components on a printed circuit board and yields in an efficient manner reliable soldering connections. However, the wave soldering process is less suitable for mounting SMD components because the SMD components are then immersed in the soldering wave and are flushed by the solder, while air and gas bubbles can remain in the soldering connections. Further, during the operation of mounting comparatively high components, the so-called Manhattan or tombstone effect can occur, which means that the soldering areas are hardly accessible for the liquid solder due to the comparatively narrow gaps between adjacent components. The mechanical strength, the reliability and the reproducibility of such soldering connections in practice do not satisfy the quality requirements imposed.

In order to solve this problem, it is suggested in the aforementioned U.S. Pat. No. 4,139,881 to provide vent holes in the printed circuit board at the area of the soldering connections between the SMD components and the printed circuit board so that air and gases can escape during soldering and the formation of bubbles is avoided. In practice, it has proved to be inappropriate to provide separate vent holes in the printed circuit board in view of the gradually increasing miniaturization and increasing printed conductor and packing density of printed circuit boards.

It has been found that during the operation of wave soldering SMD components on printed circuit boards a satisfactory wetting of the components with the solder is obtained with a reduced possibility that air and gas bubbles are formed if a double or multiple soldering wave is used. A soldering apparatus having two or more soldering waves is known, for example, from EP-B-0,058,766. Limitations are imposed by the operation of wave soldering SMD components. In order to avoid bridge formation and shortcircuit with the use of a single or double soldering wave, the following conditions must be satisfied:

1. $a \geq 1$ mm, where a is the centre distance between adjacent connection surfaces of the SMD components (FIG. 2);
2. $b \geq 0.5$ mm, where b is the distance between adjacent soldering surfaces on the printed circuit board (FIG. 2).

The first condition excludes an important group of components, i.e. IC's in VSO (Very Small Outline) envelope, QFP (Quad Flat Pack) envelope or in PLCC (Plastic Leaded Chip Carrier) envelope. The second condition is an obstacle to attain an optimum packing density.

The packing density of SMD components on a printed circuit board can be increased by the use of the reflow soldering method, which permits of reducing the minimum admissible distance b between adjacent soldering surfaces to 0.1 to 0.2 mm. Moreover, with the use of the reflow soldering method, the minimum admissible centre distance a between adjacent connection surfaces of the SMD components can be reduced to 0.3 mm, so that substantially all the SMD components commercially available are suitable for this soldering method. For soldering SMD components, the reflow soldering method is the most suitable method. When using reflow soldering, first solder is applied to the soldering surfaces of the printed circuit board, after which the components are placed with their soldering surfaces on the soldering paste, while finally the heat required is supplied to cause the solder to melt and to establish the connection between the components and the printed circuit board. For the supply of heat, various heating methods may be used, such as heat radiation, either UV radiation or IR radiation, heat conduction, liquid condensation (vapour phase) and the like. The step of fixing the components by means of glue is then omitted. During wave soldering, first the components are placed on the printed circuit board and are fixed provisionally and then the heat and the solder required for soldering are supplied simultaneously by means of a soldering wave.

The invention has for its object to provide a method of soldering components, which offers the possibility of securing both groups of components on a printed circuit board, independently of the wave soldering process and without the disadvantage and limitations inherent in the wave soldering process.

According to the invention, this object is mainly achieved in that the wire components are mounted on the printed circuit board with the intermediary of connection elements, the SMD components and the connection elements being secured on the printed circuit board by reflow soldering, while the connection wires of the wire components are connected by welding to the connection elements.

By the use of connection elements, which are secured on the printed circuit board simultaneously with the SMD components by reflow soldering, after which the connection wires of the wire components are secured by welding, the wave soldering process is rendered superfluous. Due to the method according to the invention, limitations in the packet of components are eliminated and an optimum packing density is attained. Depending upon the type of component and upon the dimensions of the components, the packing density can be increased by 25 to 100% as compared with the wave soldering process to be used otherwise.

It should be noted that U.S. Pat. No. 4,515,304 discloses a method of securing wire components and SMD components on a printed circuit board, in which solely the reflow soldering method is used. In this known method, soldering paste is applied to the printed circuit board and to the connection wires of the wire components by means of individual metering nozzles because the silk screen printing process otherwise usual cannot be used since the connection wires of the wire components make this impossible. The application of dots of solder by means of metering nozzles is a slow and time-consuming process; the application of soldering paste to the connection wires is an unreliable method with a possibility of occlusion of air bubbles, which in turn result in poor soldering connections.

In a preferred embodiment of the method according to the invention, solder is applied to soldering surfaces for SMD components and to soldering surfaces around mounting holes on the same side of the printed circuit board, whereupon SMD components and connection elements are placed on the printed circuit board and then the SMD components and the connection elements are secured on the printed circuit board by reflow soldering, while finally the wire components are placed and are connected simultaneously with their connection wires by welding to the connection elements.

In this manner, both wire components and SMD components can be secured on a one-sided printed circuit board, i.e. on a printed circuit board having a printed conductor pattern on only one side, solely by reflow soldering and along welds. The SMD components and the connection elements are placed on the solder applied to the soldering surfaces on the printed conductor side of the printed circuit board and are soldered. The wire components can be placed both on the printed conductor side and on the non-printed side of the printed circuit board, as a result of which a larger degree of freedom is given on one-sided printed circuit boards when designing the lay-out. As compared with the wave soldering process, the total number of steps is reduced.

For each connection element, a mounting hole is required. In most cases, the holes otherwise serving for passage of the connection wires will act as mounting holes, as the case may be with a larger diameter. The mounting holes may be through-metallized. The soldering tin or a lead-tin compound can be applied in the form of soldering paste, by electroplating or by hot tin-plating. For the supply of heat on behalf of the reflow soldering process, one of the heating methods already mentioned may be used.

In another preferred embodiment of the method according to the invention, before the wire components are placed, first solder is applied to soldering surfaces for SMD components and to soldering surfaces around mounting holes on the other side of the printed circuit board, after which SMD components and connection elements are placed also on this other side of the printed circuit board and then the SMD components and connection elements placed on the other side are secured on the printed circuit board by reflow soldering.

For mounting components on a double-sided printed circuit board, i.e. a printed circuit board having a printed conductor pattern on each side, first the SMD components and connection elements are secured by reflow soldering on both sides of the printed circuit board. Subsequently, the wire components are fixed by welding on the connection elements. The wire components may be placed solely on one side or solely on the other side, but will mostly be placed on both sides of the printed circuit board, as a result of which the possibilities in designing the lay-out will further be enlarged. In particular, heat-sensitive parts, which must not be immersed in a soldering wave, can be placed on both sides, which is not possible in the conventional wave soldering method. Also when mounting components on double-sided printed circuit boards, the number of steps required is smaller than with the use of the wave soldering method.

In order to prevent that during the step of reflow soldering the components on the other side of the printed circuit board, the components already soldered on the first side can fall from the printed circuit board, can slide therefrom or can get moving, the following measures can be taken: Either for soldering the components on the first side a solder is used having a melting point higher than that of the solder applied to the other side of the printed circuit board; or the components on the first side are fixed by gluing.

For establishing the welding connections between the connection wires of the wire components and the connection elements any welding process may be used which is suitable for microwelding, such as resistance welding, arc welding and the like. However, in a preferred embodiment of the method according to the invention, the connection wires are connected to the connection elements by micro-arc welding. The micro-arc welding process is a welding process frequently used and tested in the electronic industry, by means of which such welding connections can be obtained in an efficient and reproducible manner.

In a further preferred embodiment of the method according to the invention, the connection wires are connected to the connection elements by laser welding. The laser welding process has with respect to other welding processes a number of advantages, which are fully utilized in the present application, such as: accurate metering of the welding pulse, accurate positioning of the welding spot, very short welding times shorter than 0.003 sec/connection, and the like. The welding connections obtained by means of the laser welding process are very reliable so that the touch-up and repairs usual when using the wave soldering process are no longer necessary.

It should be noted that it is known per se from U.S. Pat. Nos. 3,485,996 and 3,586,816 to secure flat connection legs by laser welding on a substrate. However, the laser welding process then is not a replacement of a soldering process, but is a substitute for other bonding processes suitable for use in this technology.

A one-sided or double-sided printed circuit board having electric and/or electrical SMD components and wire components and composed by means of the method according to the invention has a number of distinct external features, i.e. the wire components are secured on the printed circuit board with the intermediary of connection elements; the connection elements are secured by means of a soldering connection on the printed circuit board; and the connection wires of the wire components are connected to the connection elements by means of a welding connection.

The invention further relates to connection elements intended for use in the method according to the invention. The connection elements may have different constructions, but are at any rate characterized by a metal body comprising a flat portion with a connection surface and a portion with a welding surface. Each connection element having these features is suitable on the one hand to act as a pseudo SMD component and to be secured by reflow soldering on a printed circuit board and is suitable on the other hand to be subjected to a welding operation. Each connection element having the above features is suitable for use in the method according to the invention.

A preferred embodiment of the connection element is characterized according to the invention in that the metal body takes the form of a cylindrical casing open at both ends and having a collar with a connection surface at one end and an annular welding surface at the other free end. The connection element according to this embodiment is intended to be placed with the collar on a mounting hole in the printed circuit board, the cylindrical casing being located in the mounting hole and the lower side of the collar constituting an annular connection surface, which bears on a soldering surface surrounding the mounting hole. The other free end of the cylindrical casing has an annular end face, which constitutes the welding surface.

In a preferred embodiment of the connection element according to the invention, the metal body takes the form of a cylindrical casing closed at one end and having a collar with a connection surface at the open end and a partition wall with a welding surface at the closed end. Also in this embodiment, the cylindrical casing is placed with the collar on a mounting hole, the cylindrical casing being located in the mounting hole. The partition wall constitutes a comparatively large continuous welding surface.

A particularly inexpensive connection element is obtained in that in a further preferred embodiment according to the invention the metal body takes the form of a U-shaped bracket having at each end a radial flange. The connection element is located with the two flanges on the edge of a mounting hole. The bottom of the U-shaped bracket constitutes the welding surface. This connection element can be stamped in an efficient manner out of tape material.

An embodiment, which is very simple, it is true, but which is not suitable for every wire component, is obtained according to the invention in that the metal body takes the form of a disk having a central welding surface and an annular connection surface concentrical with respect to the welding surface. The connection element is located with the connection surface on a mounting hole. The welding surface can be present on the upper side or on the lower side of the disk.

The invention will be described more fully with reference to the drawing. In the drawing.

Figure 1:
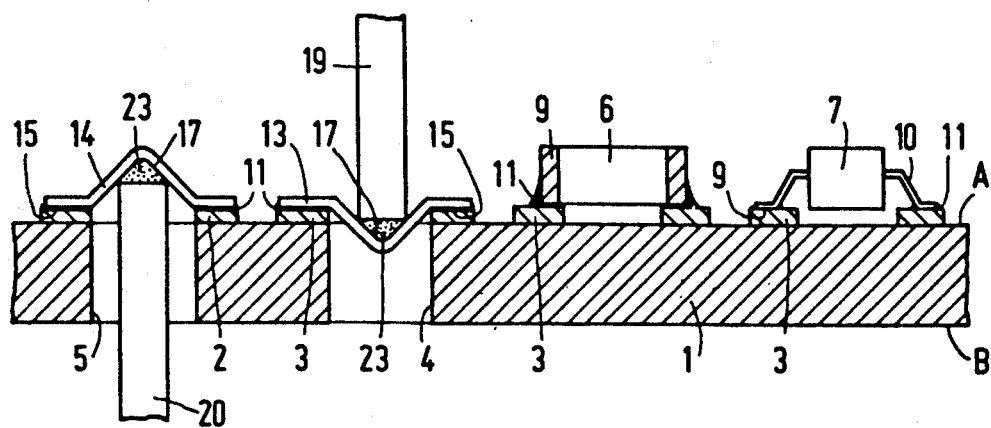
FIG. 1 shows in sectional view a one-sided printed circuit board with components mounted by means of the method according to the invention.

FIG. 1 shows in sectional view a one-sided printed circuit board having on one side a printed conductor pattern with soldering surfaces 3 and mounting holes 4 and 5. A designates the printed conductor side and B designates the non-printed side of the printed circuit board 1. An SMD component 6 with contact surfaces 9 is secured on the printed conductor side A to the relevant soldering surfaces 3 by means of soldering connections 11. Another SMD component 7 is soldered with contact legs 10 provided with contact surfaces 9 on soldering surfaces 3. The soldering connections are also denoted by reference numeral 11. Further, two connection elements 13 and 14 are provided on the printed conductor side, each element having a connection surface 15 and a welding surface 17. The connection elements are secured, like the SMD components, by means of soldering connections 11 with their connection surface 15 on annular soldering surfaces 3 around the mounting holes 4 and 5, respectively, and are located above the mounting holes. Reference numerals 19 and 20 denote each time a connection wire of wire components not shown further. These connection wires are connected by means of a welding connection 23 to the welding surface 17 of the connection elements 13 and 14 and are secured in this manner on the printed circuit board.

The components are mounted by means of the method according to the invention in the following manner: first soldering paste is locally applied on the track side A of the printed circuit board 1 to the soldering surfaces 3 intended for the SMD components and to the soldering surfaces 3 around the mounting holes 4 and 5; subsequently, the SMD components 6 and 7 and the connection elements 13 and 14 are placed on the soldering paste and are secured by means of a reflow soldering step on the soldering surfaces 3 of the printed circuit board 1. Wire components are then placed and their connection wires 19 and 20 are fixed by welding by means of a welding operation carried out simultaneously with the placement operation on the connection elements 13 and 14, respectively. Preferably, the laser welding process is used. If the wire components are placed with the connection wires 19 on the printed conductor side A of the printed circuit board 1, the laser beam is directed through the relevant mounting holes 4 onto the welding surface 17. If the wire components are placed on the nonprinted side B of the printed circuit board 1, the connection wires 20 reach through the mounting holes 5, in which event the laser beam is directed from the printed conductor side A onto the welding surface 17.

Figure 2:
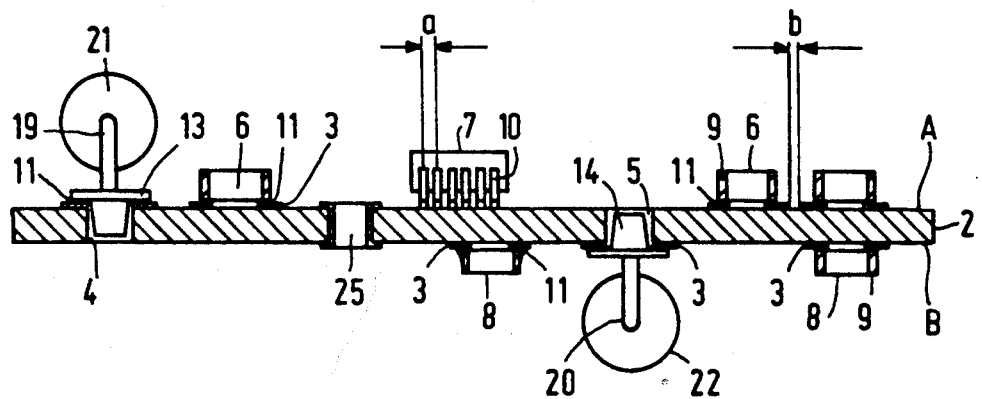
FIG. 2 shows in sectional view a double-sided printed circuit board with components mounted by means of the method according to the invention.
Figure 3:
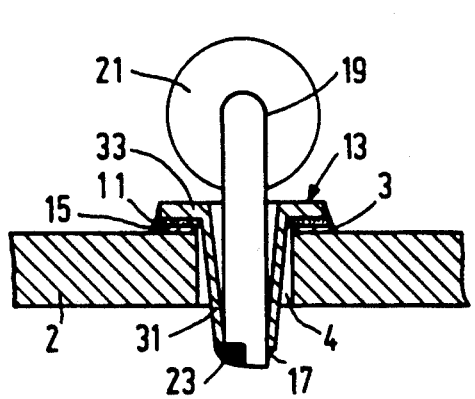
FIGS. 3 to 7 show various embodiments of the connection element used in the method according to the invention.

FIG. 2 shows an embodiment of a printed circuit board 2 printed on two sides and having soldering surfaces 3 on both sides A and B. Mounting holes are denoted by reference numerals 4 and 5, respectively, while reference numeral 25 denotes a through-metallized hole. SMD components 6 and 8, respectively, are secured with their contact surfaces 9 on soldering surfaces 3 on both sides of the printed circuit board 2 by means of soldering connections 11. An SMD element 7 with contact legs 10 is provided on the side A of the printed circuit board. On each side of the printed circuit board, a connection element 13 and 14, respectively, is provided above and below the mounting hole 4 and 5, respectively, in the manner already described with reference to FIG. 1. Wire components 21, 22 are connected by means of a welding connection of their connection wires 19, 20 to the connection elements 13, 14 and are secured on the printed circuit board 2 in this manner already described. Of each wire component only a connection wire is shown. a denotes the centre distance between adjacent contact surfaces of SMD components and b denotes the distance between adjacent soldering surfaces on the printed circuit board.

The order of succession of the various processing steps when mounting SMD components and wire components on the double-sided printed circuit board by means of the method according to the invention is as follows: first, soldering paste is locally applied on the side A of the printed circuit board 2 to the soldering surfaces 3 for the SMD components and around the mounting hole 4; then the SMD components 6 and 7 and the connection element 13 are placed on the soldering paste; subsequently, these elements are secured on the printed circuit board 2 in a first reflow soldering step. Soldering paste is then applied on the side B of the printed circuit board 2; subsequently, the SMD components 8 and the connection element 14 are placed; these parts are secured on the printed circuit board in a second reflow soldering step. Then the wire component 22 is placed and is fixed by laser welding with its connection wires 20 on connection elements 14, while finally the wire component 21 is placed and is welded on connection elements 13.

FIGS. 3 to 7 show various embodiments of the connection elements 13 and 14. In the embodiment shown in FIG. 3, the element comprises a metal body in the form of a conical casing 31 open on both ends and having a continuous collar 33 at one end and an annular end face constituting the welding surface 17 at the other free end. The lower side of the collar 33 constitutes the connection surface 15. Reference numeral 11 designates the soldering connection already described between the connection surface 15 and the soldering surface 3. Reference numeral 23 designates the welding connection i.e. a spherical weld between the welding surface 17 and a connection wire 19 of a wire component 21.

Figure 4:
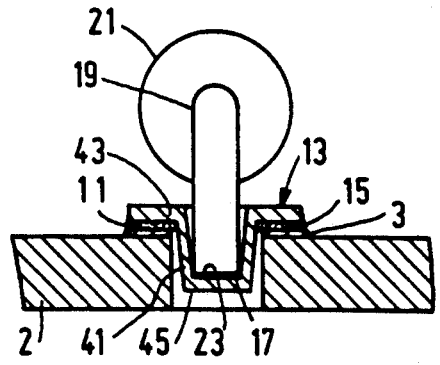

The embodiment shown in FIG. 4 also comprises a metal body in the form of a cylindrical casing 41 having an annular collar 43 at one end and a partition wall 45 at the other end. The inner side of the partition wall constitutes the welding surface 17. With the use of the laser welding process, the laser beam is directed from the lower side onto the welding surface 17.

Figure 5A:
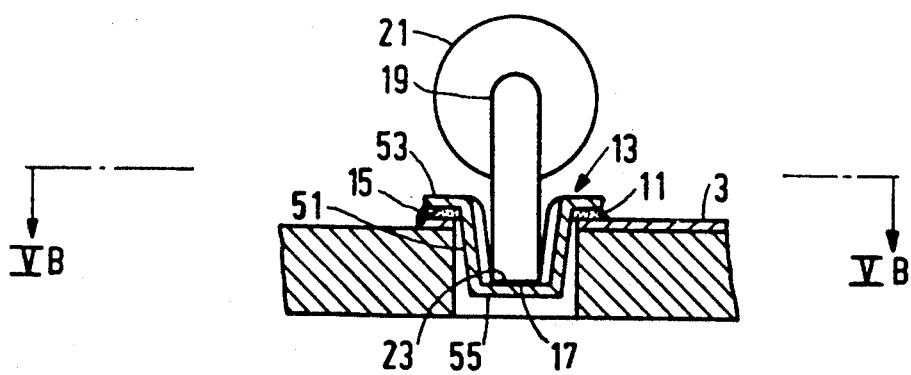
Figure 5B:
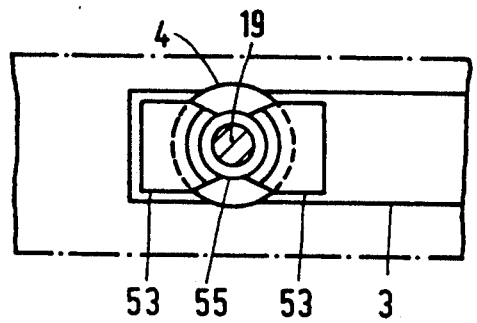

An inexpensive embodiment approaching the embodiments in the form of a cylindrical casing is shown in FIGS. 5A and 5B and consists of an angular U-shaped bracket 51 having at both ends a flange 53, by which the element bears on the soldering surface 3, and a bottom 55 with a welding surface 17. This element can be obtained in a simple manner by a stamping operation.

Figure 6:
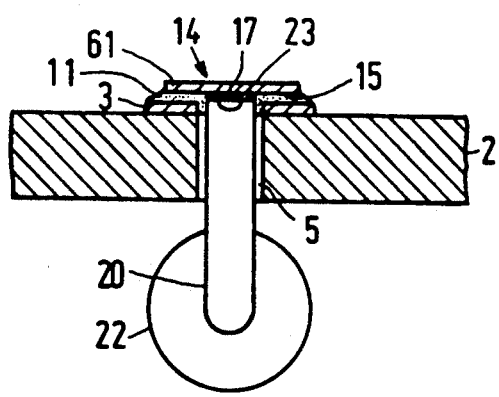
Figure 7:
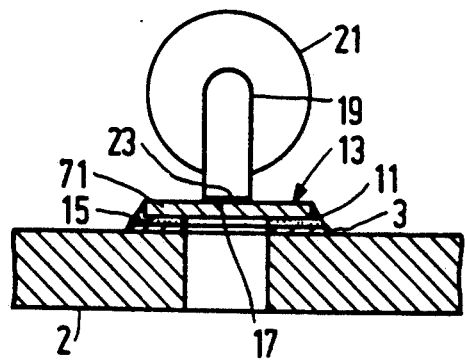

The simple embodiment shown in FIG. 6 consists of a disk-shaped plate 61 having a central circular welding surface 17 and an annular connection surface 15 concentrical with respect to the welding surface 17 on the same side of the board.

The embodiment shown in FIG. 17 bears great resemblance to that of FIG. 6 and consists of a metal disk 71 with the central welding surface 17 on one side and the annular connection surface 15 on the other side. It is supposed to be known that the connection elements, like all parts that are subjected to a soldering or welding operation must be subjected to a surface treatment, for example by electroplating. This treatment is for welding different from that for soldering. When now the welding surface is disposed on one side and the soldering surface is disposed on the other side of the disk 71, the surface treatment can be effected optimally for each side.

Connection elements of different constructions may be provided on the same printed circuit board; the most suitable connection element will be chosen for each type of wire component.

We claim:

1. A printed circuit board with surface mounted device (SMD) components and wire components comprising a printed circuit board having printed conductors, SMD components secured to the printed circuit board conductors by reflow soldering, intermediary connection elements secured to the board for securing the wires of said components thereto, the connection elements being secured to the conductors on the printed circuit board by solder joints between the connection elements and the conductors and the connection wires of the wire components being welded to the connection elements.

2. A printed circuit board construction in which the board has printed conductors on at least one side thereof and to certain of said conductors adjacent to through holes, said construction comprising:
    at least one SMD component soldered to at least one of said conductors on said at least one side such that the solder joint is between the SMD component and said at least one conductor;
    a component lead connection element soldered to one of said adjacent conductors such that the solder joint is between said connection element and the corresponding conductor; and
    an electrical wire lead component positioned over one side of said board, said component having a wire lead thereof welded to said element.

3. The construction of claim 2 wherein said element has a non-planar shape with an outer planar region soldered to a conductor and a non-planar central region welded to said component wire lead.

4. The construction of claim 3 wherein said element is positioned over one of said through holes.

* * * * *